United States Patent [19]
Hsu

[11] Patent Number: 6,146,980
[45] Date of Patent: *Nov. 14, 2000

[54] METHOD FOR MANUFACTURING SILICON SUBSTRATE HAVING GETTERING CAPABILITY

[75] Inventor: Chen-Chung Hsu, Taichung, Taiwan

[73] Assignee: United Microelectronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/917,423

[22] Filed: Aug. 26, 1997

[30] Foreign Application Priority Data

Jun. 4, 1997 [TW] Taiwan .................. 86107665

[51] Int. Cl.$^7$ .................................................. H01L 21/306
[52] U.S. Cl. .............................................................. 438/471
[58] Field of Search .................................... 438/471, 476, 438/745, 753, FOR 146

[56] References Cited

U.S. PATENT DOCUMENTS

| | | |
|---|---|---|
| 4,053,335 | 10/1977 | Hu ........................................... 438/476 |
| 5,130,260 | 7/1992 | Suga et al. ............................... 438/476 |
| 5,162,241 | 11/1992 | Mori et al. ............................... 438/476 |
| 5,374,842 | 12/1994 | Kusakabe et al. ....................... 438/476 |
| 5,389,551 | 2/1995 | Kamakura et al. ...................... 438/476 |
| 5,444,001 | 8/1995 | Tokuyama ................................ 438/476 |
| 5,506,155 | 4/1996 | Kaigawa .................................. 438/476 |
| 5,534,294 | 7/1996 | Kubota et al. ........................... 438/476 |
| 5,721,145 | 2/1998 | Kusakabe et al. ....................... 438/476 |
| 5,789,308 | 8/1998 | DeBusk et al. .......................... 438/470 |
| 5,795,809 | 8/1998 | Gardner et al. .......................... 438/471 |

*Primary Examiner*—Savitri Mulpuri
*Attorney, Agent, or Firm*—Finnegan, Henderson, Farabow, Garrett & Dunner, L.L.P.

[57] ABSTRACT

A method for manufacturing silicon substrates having gettering capability that results in a low complexity manufacturing with a corresponding reduction in the cost of production. The first embodiment of the invention involves the use of a silicon nitride layer as a mask in the etching of the silicon substrate to form the damaged layer. The second embodiment of the invention makes use of a first pad oxide layer as a mask in the etching of the silicon substrate to form the damaged layer. Hence, a single-face etching rather than double-face etching of the silicon substrate is used in the formation of the damaged layer in this invention, so there is no need for the performance of mirror processing operations before subsequent processes.

10 Claims, 5 Drawing Sheets ofMETHOD FOR MANUFACTURING SILICON SUBSTRATE HAVING GETTERING CAPABILITY

BACKGROUND OF THE INVENTION

1. Field of Invention

This invention relates to a manufacturing method for silicon substrates, and more particularly to a method for manufacturing silicon substrates having gettering capability.

2. Description of Related Art

In the manufacture of silicon substrates, the formation of dislocations is difficult to avoid if the ion implantation or annealing processes are incomplete. However, if the gettering set-up for the silicon substrate is incomplete, heavy metallic elements such as copper and aluminum will be trapped in the dislocation sites creating leakage paths. Therefore, the junction leakage current is closely related to how completely the gettering function is carried out. A well-established damaged layer formed on the bottom side of the silicon substrate is quite effective in containing the mobile heavy metallic atoms in subsequent high temperature processes, and hence is important for counteracting junction leakages at the dislocation sites. In addition, a good gettering capability for the silicon substrate makes it possible to reduce the gettering of heavy metallic ions onto the PN junctions, and thereby extending the lifetime of the integrated circuits.

FIGS. 1A through 1E are cross-sectional views showing the progression of manufacturing steps in the production of a silicon substrate having a gettering capability according to a conventional method.

As shown in FIG. 1A, the silicon substrate 10 has two faces, a first face 11 and a second face 12. First, the second face 12 of the silicon substrate 10 is etched, using a chemical etching method, to form a damaged layer 13 so that the silicon substrate is provided with the gettering capability. A total thickness of about 75~95 Å can be chemically etched from the silicon substrate 10, for example, by using a potassium hydroxide solvent formed by mixing potassium hydroxide with deionized water in a molar ratio of 1 to 6 for about 1~3 minutes.

In FIG. 1B, a passivation layer 14 composed of silicon dioxide is then deposited above the damaged layer 13 using a chemical vapor deposition (CVD) method.

As shown in FIG. 1C, in the subsequent step, the silicon substrate is flipped over so that the first face 11 is now facing up. Then, two mirror processing operations are performed. Mirror processing is actually a chemical-mechanical polishing operation aimed at getting the required flatness for the first face 11.

Next, in FIG. 1D, an epitaxial silicon layer 15 is formed over the first face 11 by putting into an oxidation pipe furnace set to a temperature of about 1140 C for the reaction.

Finally, in FIG. 1E, the passivation layer 14 is etched until the damaged layer 13 is exposed, and then followed by subsequent processes.

Because of the time consuming and complicated manufacturing processes involved in the conventional method for fabricating silicon substrates with gettering capability, production cost is increased. Moreover, when the second face 12 is etched to form the damaged layer 13, a rough and uneven first face surface 11 will be generated due to the lack of a protective passivation layer. Therefore, mirror processing operations are necessary to get the required flatness before any subsequent processes can be carried out, and this will add to the complexity of the manufacturing operation.

SUMMARY OF THE INVENTION

It is therefore an object of this invention to provide a method for manufacturing silicon substrates having not only gettering capability, but also offering some improvement regarding the disadvantages in the aforementioned conventional method.

To attain the objects and advantages and in accordance with the purpose of the invention, as embodied and broadly described herein, a method for manufacturing silicon substrates having gettering capability is provided, which comprises the steps of providing a silicon substrate; forming a first pad oxide layer and a second pad oxide layer on the two faces of the silicon substrate; forming a silicon nitride layer above the first pad oxide layer; using the silicon nitride layer as a mask to remove the second pad oxide layer until the silicon substrate is about to expose; and using the silicon nitride layer as a mask, etching the silicon substrate surface to form a damaged layer so that the silicon substrate now has the gettering capability, and this completes the manufacturing process for producing silicon substrates having gettering capability.

One of the main characteristics of the invention is that of providing a simpler manufacturing process than a conventional method of producing a silicon substrate with gettering capability, and the reduction in manufacturing complexity that will directly lead to a reduction in the cost of production.

The characteristic is attained in the first embodiment of the invention by the use of a silicon nitride layer as a mask in the etching of the silicon substrate to form the damaged layer.

The characteristic is attained in the second embodiment of the invention by the use of a first pad oxide layer as a mask in the etching of the silicon substrate to form the damaged layer.

Hence, a single-face etching rather than double-face etching of the silicon substrate is used in the formation of the damaged layer in this invention, so there is no need for the performance of mirror processing operations before subsequent processes are carried out as in a conventional method. That leads to a much simpler and time saving manufacturing operation than the conventional techniques and is very effective in reducing production cost.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1A:
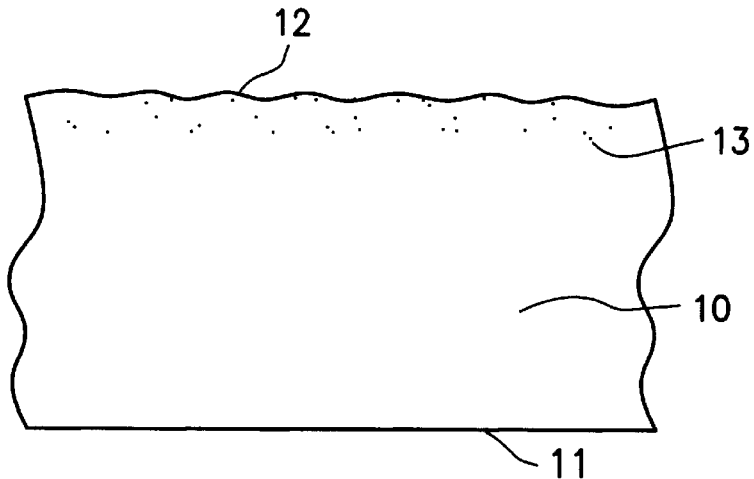
FIGS. 1A through 1E are cross-sectional views showing the progression of manufacturing steps in the production of a silicon substrate having gettering capability according to a conventional method.
Figure 1B:
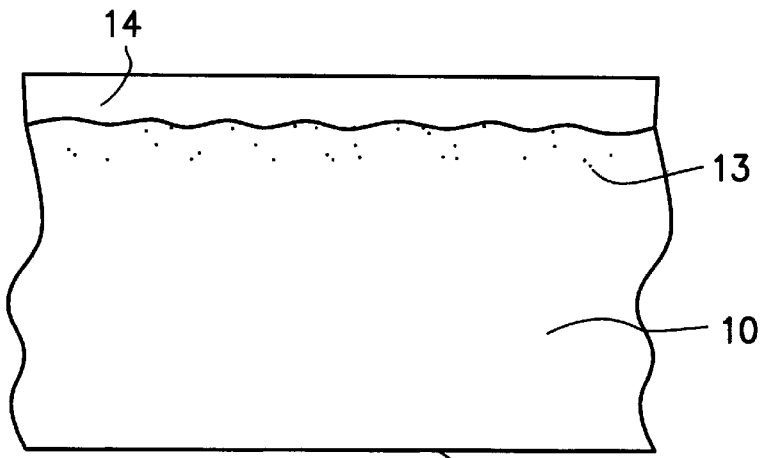
Figure 1C:
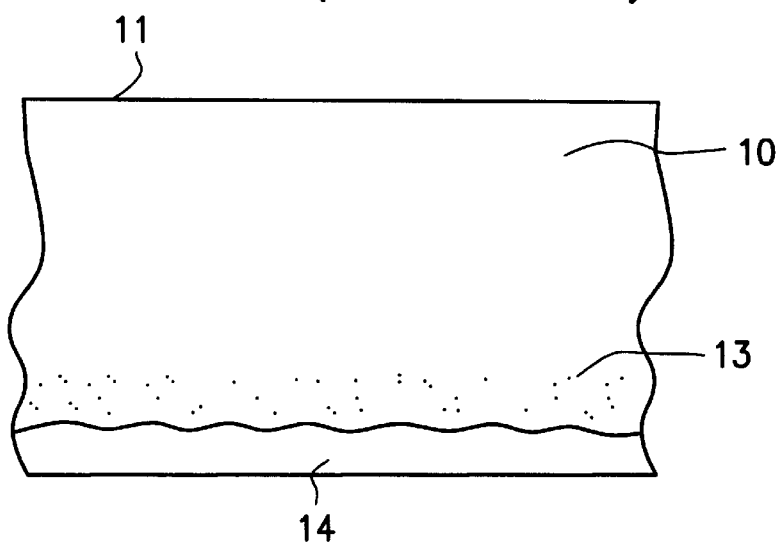
Figure 1D:
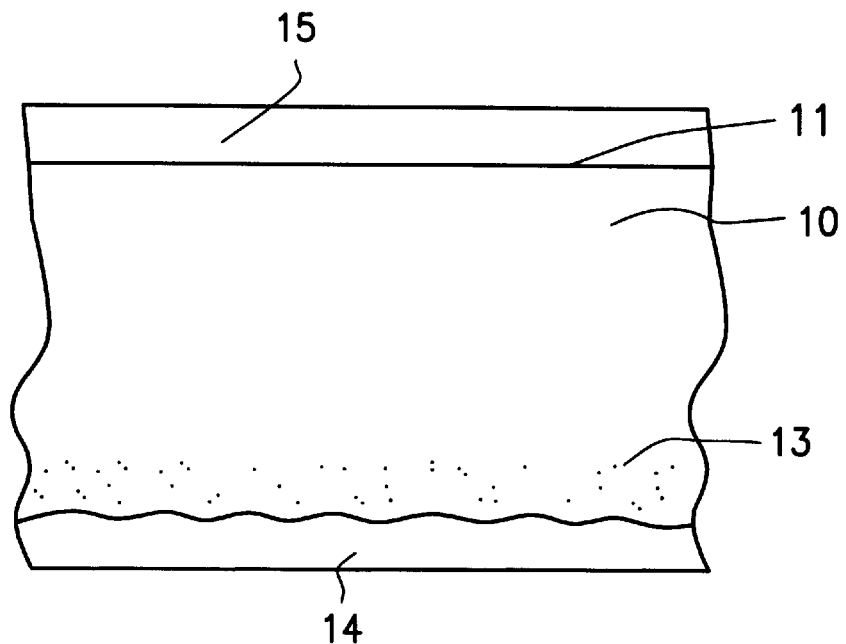
Figure 1E:
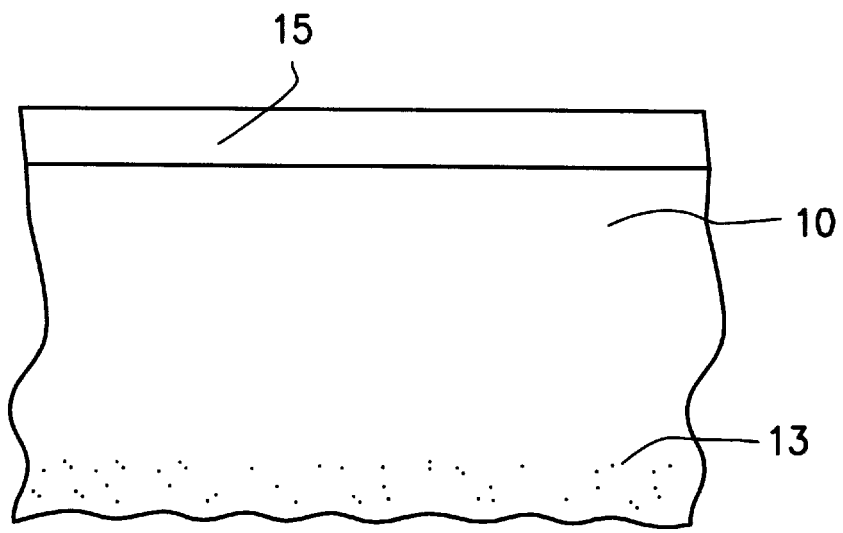
Figure 2A:
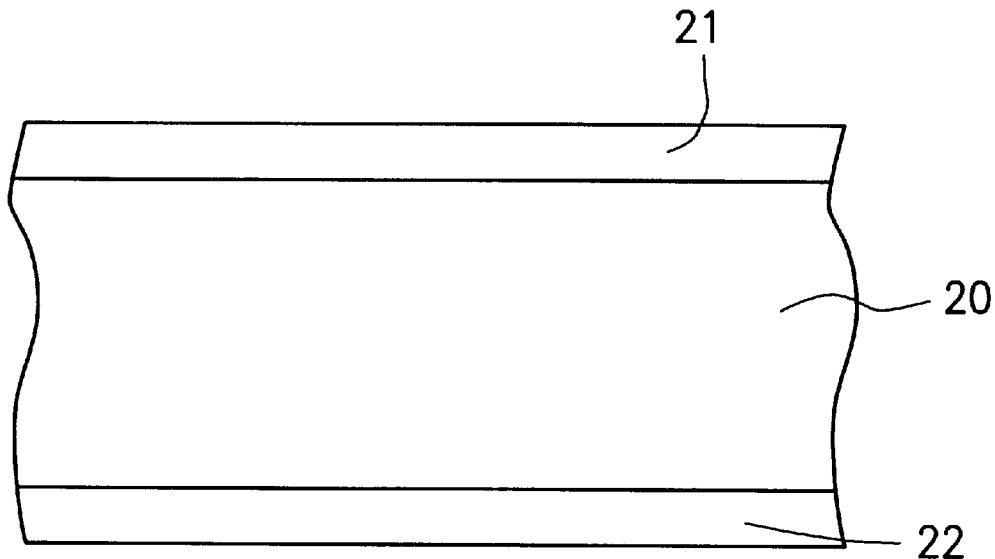
FIGS. 2A through 2D arc cross-sectional views showing the progression of manufacturing steps in the production of a silicon substrate having gettering capability according to the first preferred embodiment of the invention.

To achieve the object of the invention, an embodiment for the manufacturing of silicon substrate with gettering capability is provided. FIGS. 2A through 2D are cross-sectional views showing the progression of manufacturing steps in the production of a silicon substrate having gettering capability according to the first preferred embodiment of the invention. In FIG. 2A, a silicon substrate 20 is placed inside an oxidation pipe furnace set to a temperature of about 900 C to form a first pad oxide layer 21 and a second pad oxide layer 22, one on each side of the silicon substrate 20. Both the first pad oxide layer 21 and the second pad oxide layer 22 have the same thickness of about 100~200 Å.

Figure 2B:
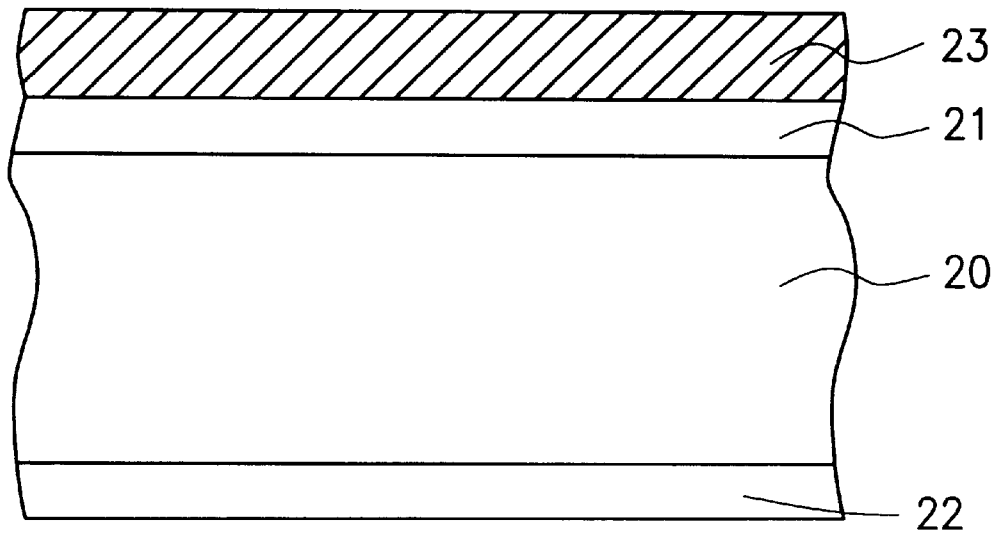

Next, in FIG. 2B, a silicon nitride layer 23 ($Si_3N_4$) is formed above the first pad oxide layer 21 using a plasma enhanced chemical vapor deposition (PECVD) method.

Figure 2C:
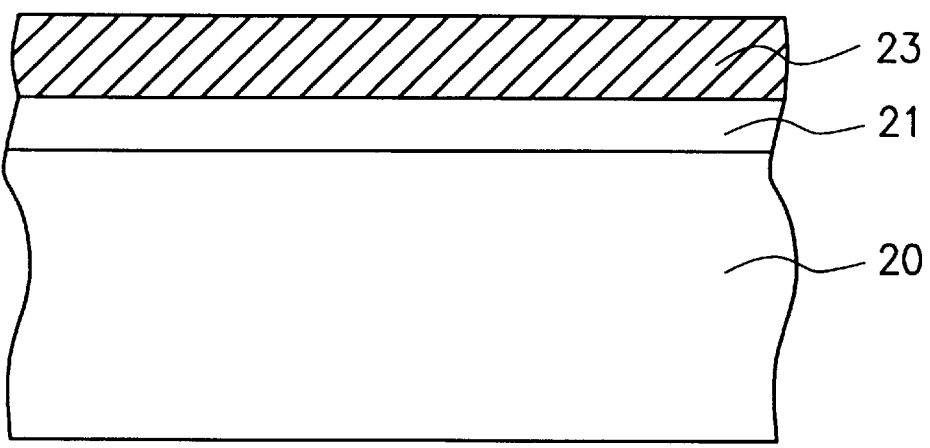
Figure 2D:
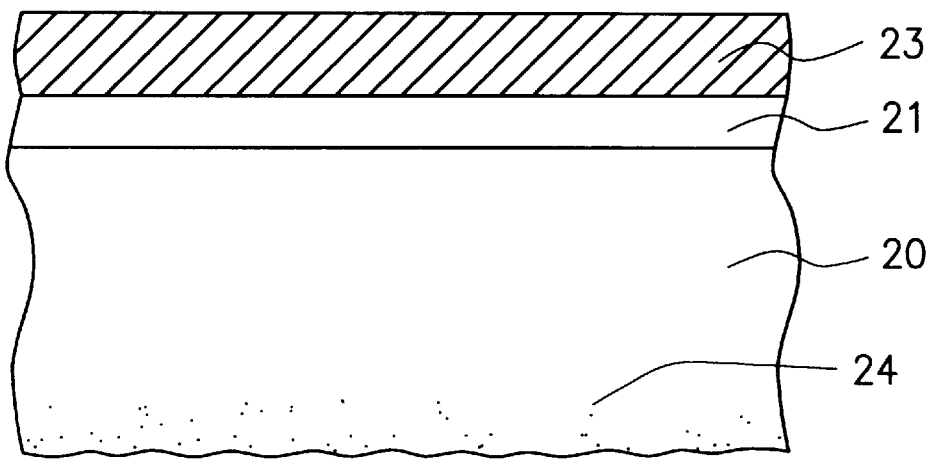

Then, in FIG. 2C, using the silicon nitride layer 23 as mask, the second pad oxide layer 22 is etched until the silicon substrate 20 is about to be exposed.

Finally, in FIG. 2D, again using the silicon nitride layer 23 as a mask, the silicon substrate surface 20 is etched by a chemical etching method. For example, a potassium hydroxide solvent, formed by mixing potassium hydroxide with deionized water in a molar ratio of 1 to 6, is used for about 1~3 minutes to etch away a layer of about 75~95 Å thick from the silicon substrate. Through the operation, a damaged layer 24, having gettering capability, is formed on the silicon substrate surface 20. That completes the manufacturing of the silicon substrate 20 having a gettering capability.

Figure 3A:
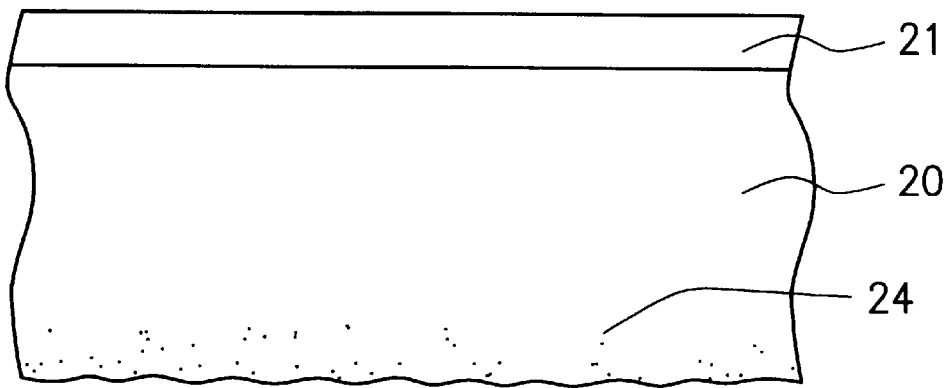
FIGS. 3A and 3B are cross-sectional views showing the progression of manufacturing steps in the production of a silicon substrate having gettering capability according to the second preferred embodiment of the invention.
Figure 3B:
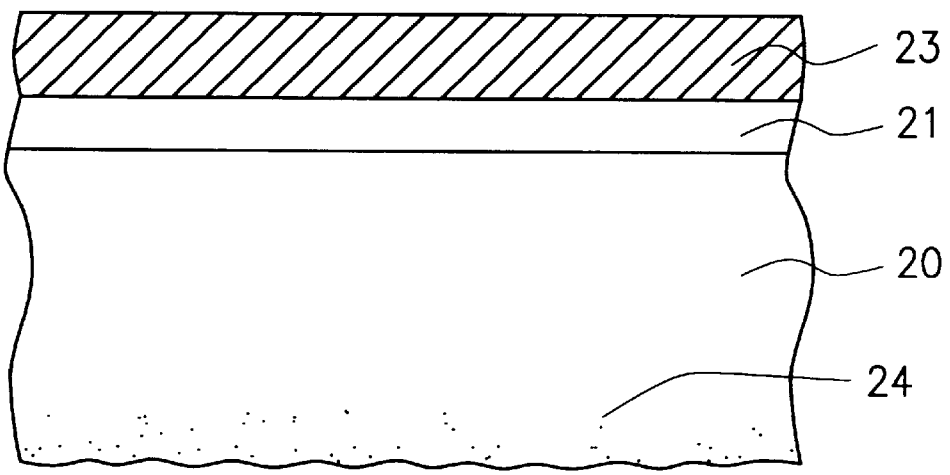

In addition to the above embodiment, another embodiment can be used to achieve the object of the invention. FIGS. 3A and 3B are cross-sectional views showing the progression of manufacturing steps in the production of a silicon substrate having gettering capability according to the second preferred embodiment of the invention.

First, processing steps similar to those of FIG. 2A are repeated to form a structure similar to that as shown in FIG. 2A.

Next, in FIG. 3A, using the first pad oxide layer 21 as a mask, the second pad oxide layer 22 is etched until the silicon substrate is about to be exposed. Subsequently, a thickness of about 75~95 Å is etched away from the exposed silicon substrate 20, forming a damaged layer 24 on the silicon substrate surface 20, so that a silicon substrate 20 having gettering capability is created. The silicon substrate 20 can be etched, for example, by using a potassium hydroxide solvent formed by mixing potassium hydroxide with deionized water in a molar ratio of 1 to 6 for about 1~3 minutes.

Thereafter, in FIG. 3B, a silicon nitride layer 23 is formed above the first pad oxide layer 21 by a plasma enhanced chemical vapor deposition (PECVD) method, and the manufacturing of the silicon substrate 20 having gettering capability is completed.

One of the main characteristics of the invention is that of providing a simpler manufacturing process than a conventional method of producing a silicon substrate with gettering capability, and the reduction of manufacturing complexity directly leading to a reduction in production costs.

The characteristic is attained in the first embodiment of the invention by the use of a silicon nitride layer 23 as a mask in the etching of the silicon substrate 20 to form the damaged layer 24.

The characteristic is attained in the second embodiment of the invention by the use of a first pad oxide layer 21 as a mask in the etching of the silicon substrate 20 to form the damaged layer 24.

Hence, a single-face etching, rather than double-face etching, of the silicon substrate 20 is used in the formation of the damaged layer 24 in this invention, and so there is no need for the performance of mirror processing operations before subsequent processes as in a conventional method. That leads to a much simpler and time saving manufacturing operation than the conventional techniques and is very effective in reducing production cost.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for manufacturing silicon substrates having gettering capability, which comprises the steps of:
    (a) providing a silicon substrate having a top surface and a bottom surface;
    (b) forming a first pad oxide layer over the top surface, and a second pad oxide layer over the bottom surface;
    (c) forming a silicon nitride layer only above the first paid oxide layer;
    (d) using the silicon nitride layer as a mask to remove the second pad oxide layer until the bottom surface of the silicon substrate is at least partially exposed; and
    (e) using the silicon nitride layer as a mask, etching the bottom surface of the silicon substrate for about 1–3 minutes using a solvent composed of potassium hydroxide and deionized water in a molar ratio of 1 to 6 so that the silicon substrate has the gettering capability, wherein the etched bottom surface forms a damaged layer having a thickness of about 75–95 Å.

2. A method for manufacturing silicon substrate having gettering capability according to claim 1, wherein step (b) comprises placing the silicon substrate inside an oxidation pipe furnace set to a temperature of about 900° C. for the reaction.

3. A method for manufacturing silicon substrate having gettering capability according to claim 1, wherein in step (b), the thickness of the first pad oxide layer and the second pad oxide layer are both about 100~200 Å.

4. A method for manufacturing silicon substrate having gettering capability according to claim 1, wherein step (c) comprises a process of plasma enhanced chemical vapor deposition.

5. A method for manufacturing silicon substrate having gettering capability according to claim 1, wherein in step (c), the thickness of the silicon nitride layer is about 1000~2000 Å.

6. A method for manufacturing silicon substrates having gettering capability, which comprises the steps of:
    (a) providing a silicon substrate having a top surface and a bottom surface;
    (b) forming a first pad oxide layer over the top surface, and a second pad oxide layer over the bottom surface;
    (c) using the first pad oxide layer as a mask to remove the second pad oxide layer;
    (d) etching the bottom surface of the silicon substrate for about 1–3 minutes using a solvent composed of potassium hydroxide and deionized water in a molar ratio of 1 to 6 to form a damaged layer so that the silicon substrate has the gettering capability, the damaged layer having a thickness of about 75–95 Å; and (e) forming a silicon nitride layer only over the first pad oxide layer.

7. A method for manufacturing silicon substrate having gettering capability according to claim 6, wherein step (b) comprises placing the silicon substrate inside an oxidation pipe furnace set to a temperature of about 900° C. for the reaction.

8. A method for manufacturing silicon substrate having gettering capability according to claim 6, wherein in step (b), the thickness of the first pad oxide layer and the second pad oxide layer are both about 100~200 Å.

9. A method for manufacturing silicon substrate having gettering capability according to claim 6, wherein step (e) comprises a process of plasma enhanced chemical vapor deposition.

10. A method for manufacturing silicon substrate having gettering capability according to claim 6, wherein in step (e), the thickness of the silicon nitride layer is about 1000~2000Å.

* * * * *